United States Patent
Kontani et al.

(10) Patent No.: US 9,543,281 B2
(45) Date of Patent: Jan. 10, 2017

(54) SEMICONDUCTOR DEVICE HAVING A SUBSTRATE AND INPUT AND OUTPUT ELECTRODE UNITS

(71) Applicant: KABUSHIKI KAISHA TOYOTA JIDOSHOKKI, Kariya-shi (JP)

(72) Inventors: Kazuyoshi Kontani, Kariya (JP); Toshiaki Nagase, Kariya (JP); Naohito Kanie, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 0 days.

(21) Appl. No.: 14/597,791

(22) Filed: Jan. 15, 2015

(65) Prior Publication Data

US 2015/0206860 A1 Jul. 23, 2015

(30) Foreign Application Priority Data

Jan. 17, 2014 (JP) ................ P2014-006584

(51) Int. Cl.
*H05K 7/00* (2006.01)
*H01L 25/16* (2006.01)
(Continued)

(52) U.S. Cl.
CPC ........... *H01L 25/165* (2013.01); *H01L 23/053* (2013.01); *H01L 25/0655* (2013.01);
(Continued)

(58) Field of Classification Search
CPC .............. H02M 7/003; H05K 1/144; H05K 2201/2036; H05K 1/181; H05K 2201/10409; H05K 2201/10598; H05K 7/026; H05K 1/0271; H05K 1/14; H05K 2201/041; H05K 2201/042; H05K 2201/09754; H05K 7/20845; H05K 7/2089;H05K 7/1432; H01R 11/26; H01L 2924/1011; H01L 25/162; H01L 23/053; H01L 23/4006; H01L 25/165; H01L 25/0655
(Continued)

(56) References Cited

U.S. PATENT DOCUMENTS

| 5,444,295 A * | 8/1995 | Lake | ............ H01L 23/66 257/678 |
|---|---|---|---|
| 5,715,141 A | 2/1998 | Karlsson | |

(Continued)

FOREIGN PATENT DOCUMENTS

| EP | 1160866 A2 | 12/2001 |
|---|---|---|
| EP | 1696546 A2 | 8/2006 |

(Continued)

OTHER PUBLICATIONS

European Patent Application No. 15150598.9: Extended European Search Report dated Jan. 4, 2016, 9 pages.

*Primary Examiner* — James Wu
(74) *Attorney, Agent, or Firm* — Baker & Hostetler LLP

(57) ABSTRACT

A plurality of arm elements is arrayed along a first direction of a substrate. Each arm element includes a plurality of semiconductor elements connected in parallel. Each arm element is configured such that a plurality of semiconductor elements is arrayed along a second direction of the substrate which is perpendicular to the first direction and separated into a first element group and a second element group. The substrate includes a first region where the semiconductor element included in the first element group is arranged and a second region where the semiconductor element included in the second element group is arranged, and the first region and the second region are separated along the second direction. An input electrode unit and an output electrode unit are arranged along the first direction in a region pro- (Continued)

vided between the first region and the second region on the substrate.

3 Claims, 6 Drawing Sheets

(51) Int. Cl.
*H05K 1/18* (2006.01)
*H01L 23/053* (2006.01)
*H01L 25/065* (2006.01)
*H02M 7/00* (2006.01)
*H05K 7/14* (2006.01)

(52) U.S. Cl.
CPC ............ *H02M 7/003* (2013.01); *H05K 1/181* (2013.01); *H05K 7/1432* (2013.01); *H01L 2924/0002* (2013.01); *H01L 2924/1011* (2013.01)

(58) Field of Classification Search
USPC ....... 174/50, 50.52; 361/752, 760, 783, 784, 361/796, 801, 803; 439/74, 76.1, 76.2, 78
See application file for complete search history.

(56) References Cited

U.S. PATENT DOCUMENTS

| | | | |
|---|---|---|---|
| 6,566,750 B1* | 5/2003 | Sofue | H01L 24/49 257/723 |
| 2006/0141821 A1* | 6/2006 | Berglund | H01R 12/515 439/76.1 |
| 2006/0192509 A1* | 8/2006 | Nakakita | H02M 7/003 318/139 |

FOREIGN PATENT DOCUMENTS

| | | | |
|---|---|---|---|
| EP | 1758440 A2 | | 2/2007 |
| JP | 3173512 U | * | 2/2012 |
| JP | 3173512 U | | 11/2012 |

* cited by examiner

SEMICONDUCTOR DEVICE HAVING A SUBSTRATE AND INPUT AND OUTPUT ELECTRODE UNITS

CROSS-REFERENCE TO RELATED APPLICATIONS

This application claims priority to Japanese Application No. P2014-006584 filed Jan. 17, 2014, the disclosure of which is incorporated herein by reference in its entirety.

BACKGROUND OF THE INVENTION

Field of the Invention

The present invention relates to a semiconductor device.

Related Background Art

As a conventional semiconductor device, for example, semiconductor devices discussed in U.S. Pat. No. 5,715,141 and JP Registered Utility Model Publication No. 3,173,512 are known. The semiconductor device discussed in U.S. Pat. No. 5,715,141 includes a plurality of electrode terminal secured on a substrate and a plurality of power elements mounted close to the electrode terminal on the substrate. The semiconductor device discussed in JP Registered Utility Model Publication No. 3,173,512 includes a plurality of semiconductor element groups mounted on a main circuit board and terminals secured on the main circuit board, that is, a positive input electrode terminal, a negative input electrode terminal, and three output terminals. Each of the semiconductor element groups and each of the terminals are alternately arranged.

SUMMARY OF THE INVENTION

The prior art however has a problem as described below. Specifically, the semiconductor device discussed in U.S. Pat. No. 5,715,141 has different current path length from the electrode terminal to each power element, so that the timings of the current flowing into the power element are different. This results in large current unbalance among power elements. It is required to design the power element based on the smallest current among those flowing in the power elements. Accordingly, when the current unbalance is large, it is required to increase the number of power elements to obtain a desired output current, which results in the requirement for a larger device.

The semiconductor device discussed in JP Registered Utility Model Publication No. 3,173,512 has a constant current path length between the positive input electrode terminal and each semiconductor element in the semiconductor element group. Therefore, the timings of a current flowing into each semiconductor element are almost the same, and therefore the current unbalance among semiconductor elements is small. However, since the electrode terminal and the output terminal extend in the direction along which the semiconductor elements are arrayed (the direction perpendicular to the direction along which the semiconductor element groups are arrayed), a large space for the electrode terminal and the output terminal are required. Thus, the device becomes large.

One object of the present invention is to provide a semiconductor element that can suppress the effect of current unbalance among semiconductor elements and can be downsized.

One aspect of the present invention is a semiconductor device including a substrate provided with a main circuit including a plurality of arm elements, an input electrode unit provided on the substrate and configured to supply power to the main circuit, and an output electrode unit provided on the substrate and being connected to a midpoint between the two arm elements connected in series. Each of the plurality of arm elements includes a plurality of semiconductor elements connected in parallel. The plurality of arm elements is arrayed along a first direction of the substrate. Each of the arm elements is configured with a plurality of semiconductor elements arrayed along a second direction of the substrate perpendicular to the first direction and the plurality of semiconductor elements is separated into a first element group and a second element group. The substrate includes a first region where the semiconductor element included in the first element group is arranged and a second region where the semiconductor element included in the second element group is arranged, and the first region and the second region are separated along the second direction. The input electrode unit and the output electrode unit are arranged along the first direction in a third region provided between the first region and the second region on the substrate.

In the aspect, the semiconductor element included in the first element group is arranged in the first region and the semiconductor element included in the second element group is arranged in the second region. The input electrode unit and the output electrode unit are arranged along the first direction in the third region. The third region is provided between the first region and the second region which are separated along the second direction. Therefore, for example, compared to a configuration in which the input electrode unit and the output electrode unit are arranged in the outer side along the second direction of the plurality of semiconductor elements arrayed along the second direction, the difference in current path length from the input electrode unit and the output electrode unit to each semiconductor element is small. Thus, the difference in the timing of a current flowing into the semiconductor element can be kept small, and the influence of the current unbalance among the semiconductor elements can therefore be kept small. As a result, it is not necessary to increase the number of semiconductor elements than required to obtain a desired output current, so that the substrate need not be large. Further, the input electrode unit and the output electrode unit are not required to extend along the direction along which the semiconductor elements are arrayed to reduce the current unbalance among the semiconductor elements. The substrate need not be large also from this view point. The semiconductor device can therefore be downsized.

In the aspect, an input electrode may be mounted on the input electrode unit. The input electrode may have a shape of which a width in the first direction is wider than a width in the second direction. The dimension of the substrate in the first direction depends on the number of rows of arm elements. When the input electrode unit and the output electrode unit are arranged in the third region, the substrate has a spare space along the first direction. This allows designing the input electrode unit, and also the input electrode, to have a long dimension along the first direction of the substrate. If the input electrode has a shape of which a width in the first direction is wider than a width in the second direction, sufficient connecting area to carry current can be secured even when the input electrode has a small dimension in the second direction. By providing a small dimension in the second direction to the input electrode, the dimension of the substrate in the second direction can be made small. Thus, the semiconductor device can further be downsized.

In the aspect, the input electrode may have a rectangular shape of which a longitudinal direction is identical to the first direction. In this case, the third region provided between the first region and the second region can efficiently be used to secure a sufficient connecting area on the input electrode to carry current.

In the aspect, at least a portion of the input electrode unit may be included in a plurality of semiconductor elements constituting one of the arm elements and located between two semiconductor elements adjoining each other along the second direction with a third region in between, and at least a portion of the output electrode unit may be included in a plurality of semiconductor elements constituting another one of arm elements adjoining the one of the arm elements along the first direction and may be located between semiconductor elements arrayed along the second direction with the third region in between. In this case, the dimension of the substrate in the first direction is small compared to the configuration in which the input electrode unit and the output electrode unit are arranged between two arm elements arrayed along the first direction. Thus, the semiconductor device can further be downsized.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The embodiment of the present invention will be described in detail referring to the attached drawings. In the description, the same component or the component having the same function is denoted with the same reference sign and repeated description thereof will be omitted. Dimensional ratios in each drawing may be different from the actual dimensional ratios.

Figure 1:
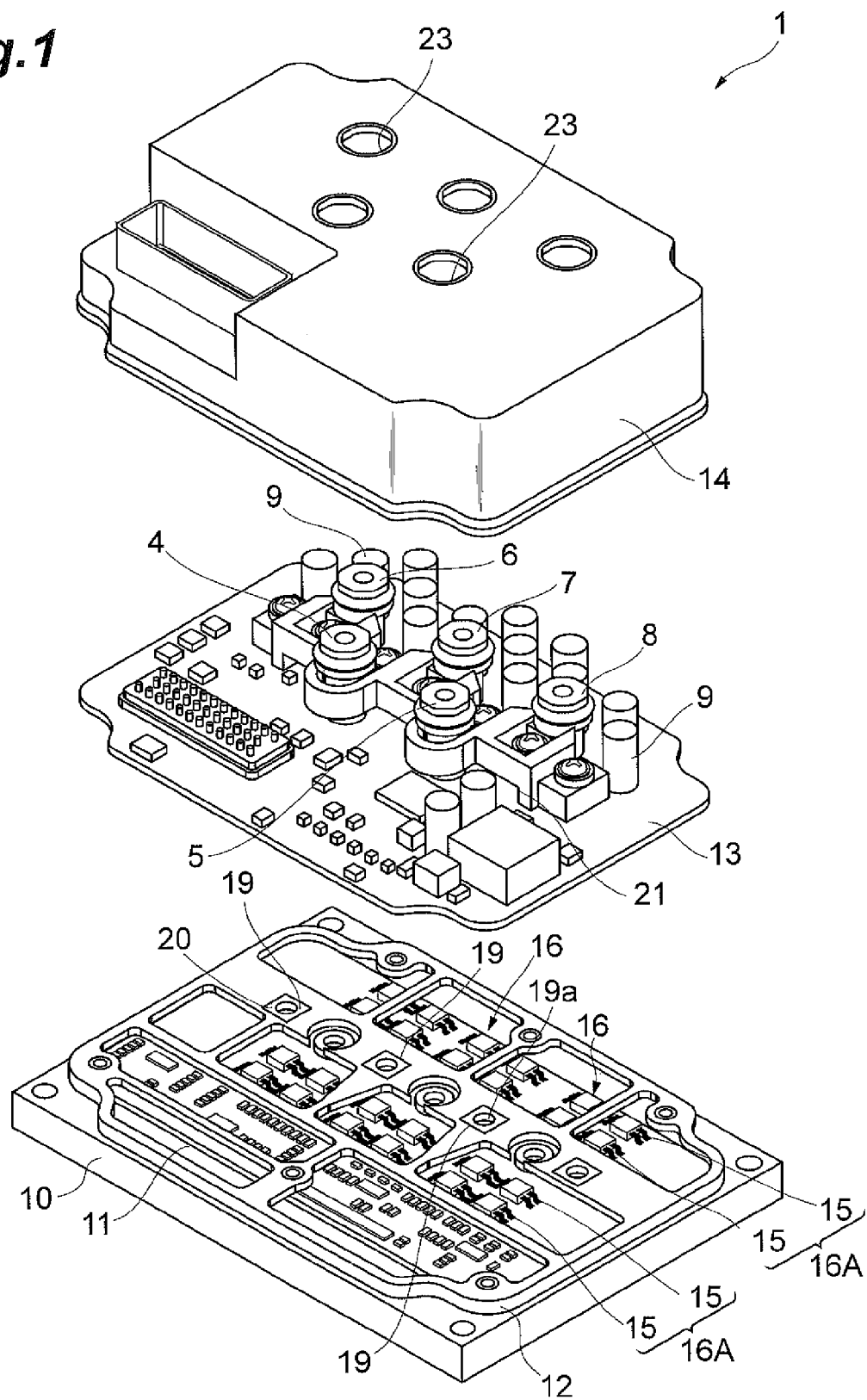
FIG. 1 is an exploded perspective view illustrating an inverter device according to an embodiment of the present invention.
Figure 2:
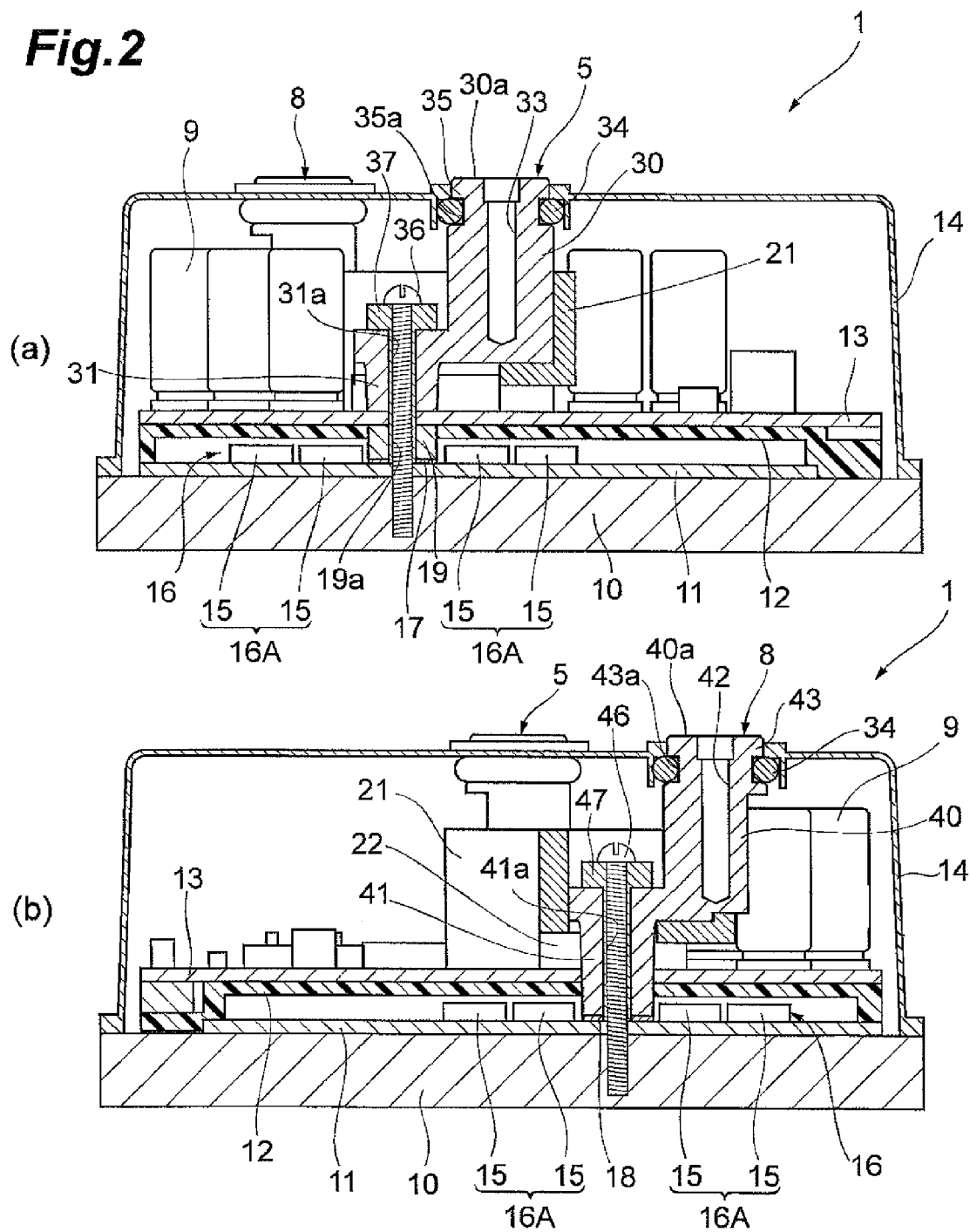
FIG. 2 is sectional views of the inverter device illustrated in FIG. 1.

FIG. 1 is an exploded perspective view illustrating an inverter device according to the embodiment. FIG. 2 is sectional views of the inverter device illustrated in FIG. 1. In FIG. 2, (a) is a sectional view taken along the line IIA-IIA in FIG. 5 and (b) is a sectional view taken along the line IIB-IIB in FIG. 5. The inverter device 1 of the embodiment is, for example, a three-phase inverter device for driving a three-phase AC motor.

Figure 3:
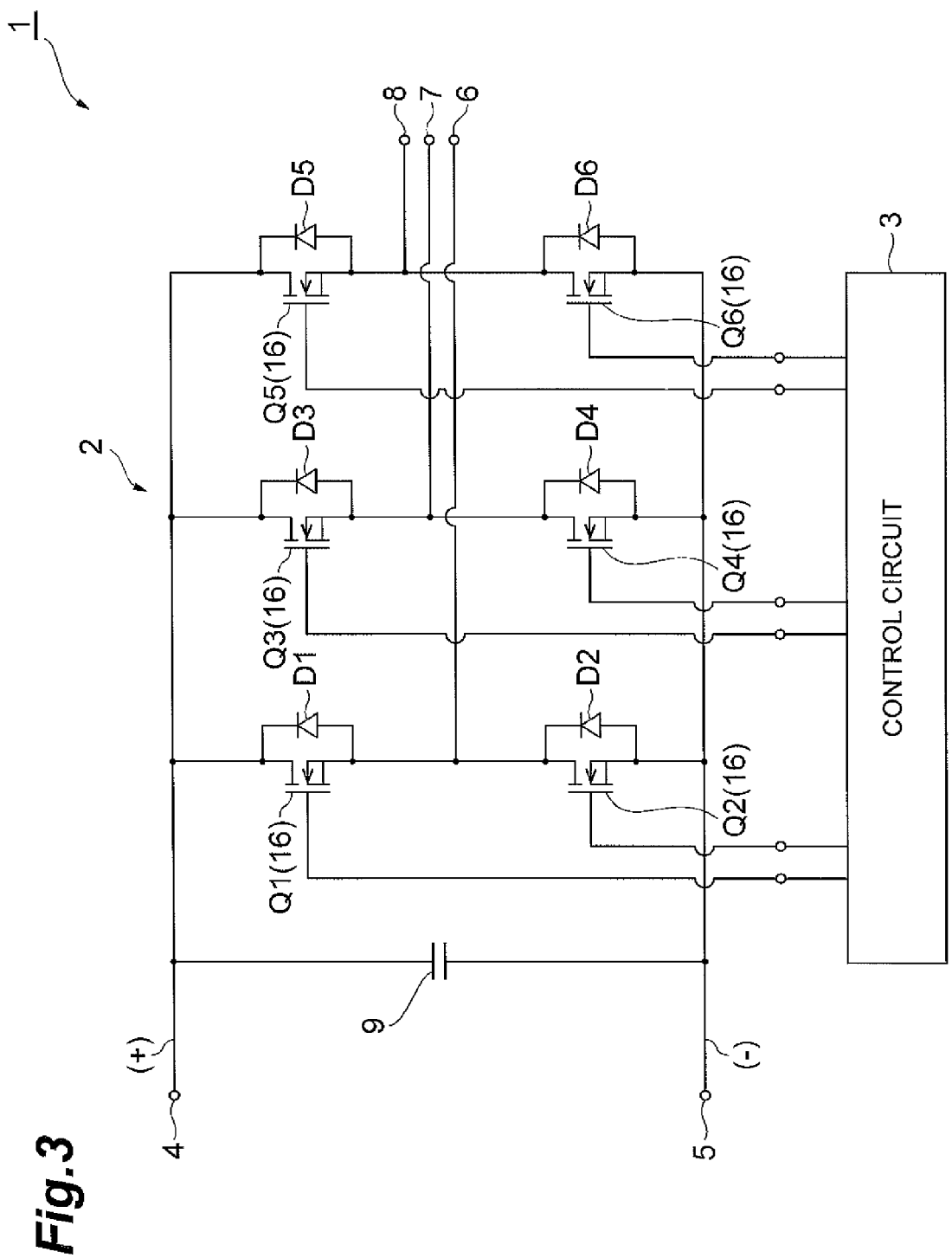
FIG. 3 is a circuit diagram of the inverter device illustrated in FIG. 1.

FIG. 3 is a circuit diagram of the inverter device 1. As illustrated in FIG. 3, the inverter device 1 includes a main circuit 2, a control circuit 3 for controlling the main circuit 2, and a positive electrode terminal 4 and a negative electrode terminal 5. The positive electrode terminal 4 and the negative electrode terminal 5 are connected to the main circuit 2, which is an internal circuit, and an external power source (not shown) such as batteries. The positive electrode terminal 4 and the negative electrode terminal 5 are input terminals to supply power to the main circuit 2 from the external power source.

The main circuit 2 includes six switching elements Q1 to Q6 connected in a three-phase bridge and flywheel diodes D1 to D6 each of which connected in parallel to each of the switching elements Q1 to Q6. For example, metal oxide semiconductor field effect transistor (MOSFET) is used for the switching elements Q1 to Q6. In FIG. 3, a switching element group 16 (see FIG. 1) including a plurality of switching elements (e.g., four switching elements) 15 connected in parallel is illustrated as a component equivalent to each of switching elements Q1 to Q6. A group including the switching elements Q1, Q3, and Q5 and the flywheel diodes D1, D3, and D5 constitutes an upper arm. A group including the switching elements Q2, Q4, and Q6 and the flywheel diodes D2, D4, and D6 constitutes a lower arm.

The switching elements Q1 and Q2 are connected in series between the positive electrode terminal 4 and the negative electrode terminal 5. A U-phase output terminal 6 is connected to the connecting points (midpoints) of the switching elements Q1 and Q2. The switching elements Q3 and Q4 are connected in series between the positive electrode terminal 4 and the negative electrode terminal 5. A V-phase output terminal 7 is connected to the connecting points (midpoints) of the switching elements Q3 and Q4. The switching elements Q5 and Q6 are connected in series between the positive electrode terminal 4 and the negative electrode terminal 5. A W-phase output terminal 8 is connected to the connecting points (midpoints) of the switching elements Q5 and Q6. The U-phase output terminal 6, the V-phase output terminal 7, and the W-phase output terminal 8 are output terminals for supplying three-phase AC power to an external motor.

A capacitor 9 which is an electronic component constituting the main circuit 2 is connected between the positive electrode terminal 4 and the negative electrode terminal 5. In FIG. 3, a plurality of capacitors 9 connected to the main circuit 2 is illustrated as a single capacitor (see FIGS. 1 and 2).

The control circuit 3 controls switching (ON/OFF) of each of the switching elements Q1 to Q6. The control circuit 3 can be configured as a part of an electronic control unit (ECU). For example, the control circuit 3 switches each of the switching elements Q1 to Q6 as required according to a load condition and a value required from an operator.

Now, referring back to FIGS. 1 and 2. The inverter device 1 includes a lower substrate 11 arranged on a heat sink 10, an upper substrate 13 arranged above the lower substrate 11 with a spacer bracket 12 in between, a case 14 covering the lower substrate 11 and the upper substrate 13, the positive electrode terminal 4 and the negative electrode terminal 5 (hereinafter, may referred to as input terminals 4 and 5), and the U-phase output terminal 6, the V-phase output terminal 7, and the W-phase output terminal 8 (hereinafter, may referred to as output terminals 6 to 8). The lower substrate 11 is, for example, an insulated metal substrate (IMS). The upper substrate 13 is, for example, a printed circuit board. The lower substrate 11 and the upper substrate 13 are screwed on the heat sink 10. The case 14 is also screwed on the heat sink 10.

Figure 4:
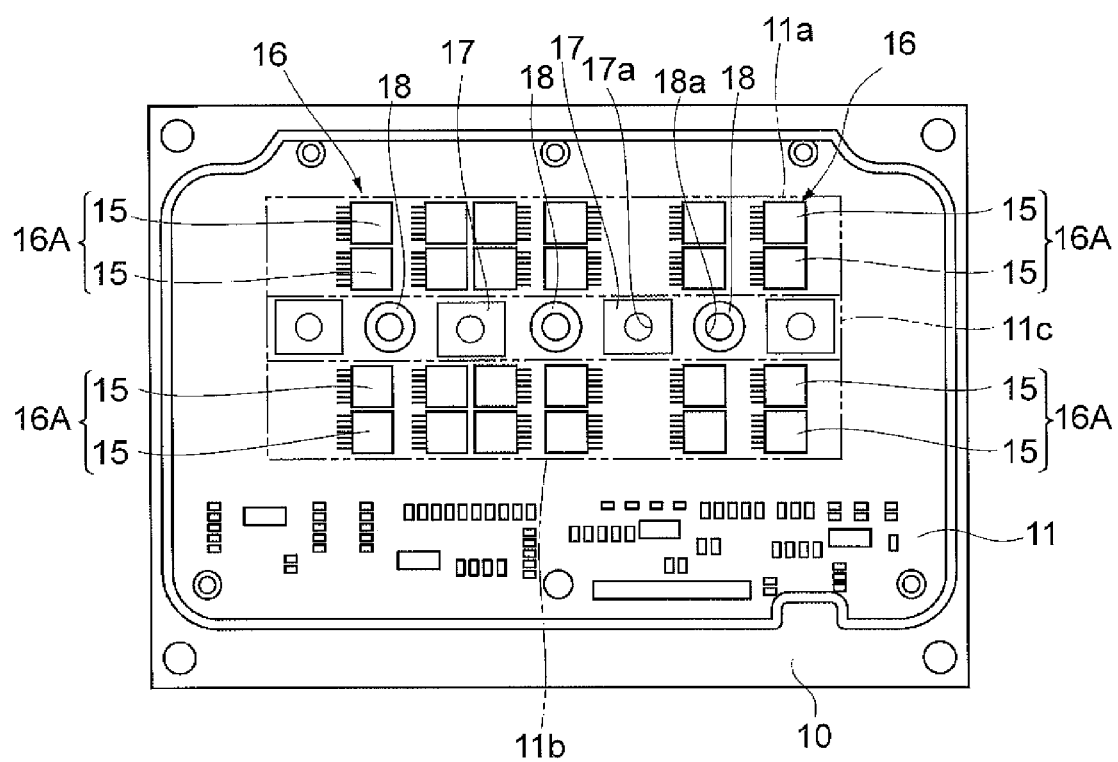
FIG. 4 is a plan view illustrating a structure of a lower substrate illustrated in FIG. 1 mounted with components.

An electronic component constituting a part of the main circuit 2 is mounted on the lower substrate 11. Specifically, as illustrated in FIG. 4, the switching element group 16 including a plurality of switching elements (four switching elements, in the embodiment) 15 is mounted on the lower substrate 11 so as to be arrayed along a longitudinal direction (a first direction) of the lower substrate 11. In the embodiment, the switching element groups 16 are arranged in six rows. These switching element groups 16 constitute the switching elements Q1 to Q6.

The switching element group 16 constituting an upper arm element and the switching element group 16 constituting a lower arm element are mounted so as to adjoin each other along the longitudinal direction of the lower substrate 11. That is, the main circuit 2 including a plurality of arm elements is provided on the lower substrate 11. The switching element group 16 of the upper arm element and the switching element group 16 of the lower arm element are arranged to be in proximity to each other. Thus, the wiring distance between the switching element group 16 of the upper arm element and the switching element group 16 of the lower arm element is reduced, thereby reducing parasitic inductance of the main circuit 2.

The four switching elements 15 constituting the switching element group 16 are connected in parallel as described above and arrayed along a direction perpendicular to the longitudinal direction of the lower substrate 11 (a second direction). Four switching elements 15 are separated into two sets of element groups 16A. As illustrated in FIG. 4, the lower substrate 11 includes a first region 11a and a second region 11b separately provided along the second direction and a third region 11c provided between the first region 11a and the second region 11b. The switching element 15 included in one of element groups (a first element group) 16A is mounted in the first region 11a on the lower substrate 11. The switching element 15 included in the other element group (a second element group) 16A is mounted in the second region 11b on the lower substrate 11. That is, the switching element 15 included in the one of the element groups 16A and the switching element 15 included in the other of the element groups 16A are separately mounted on the lower substrate 11 along the second direction. The number of the switching elements 15 included in the one of the element groups 16A and the number of the switching elements 15 included in the other of the element groups 16A are equal. In the embodiment, each of the element groups 16A includes two switching elements 15.

As illustrated in FIG. 4, a plurality of input electrode patterns (input electrode units) 17 and a plurality of output electrode patterns (output electrode units) 18 are arranged in the third region 11c provided between the element groups 16A on the lower substrate 11. The input electrode pattern 17 and the output electrode pattern 18 are alternately arrayed along the longitudinal direction of the lower substrate 11. FIG. 4 is a plan view illustrating the lower substrate 11 without a spacer bracket 12 mounted thereon. The input electrode pattern 17 supplies power to the main circuit 2. The output electrode pattern 18 is connected to the output terminals 6 to 8. Each of the input electrode pattern 17 and the output electrode pattern 18 is electrically connected to each switching element 15 via a wiring pattern (not shown).

The input electrode pattern 17 has a shape extending along the longitudinal direction of the lower substrate 11. In the embodiment, the input electrode pattern 17 has a rectangular shape of which a longitudinal direction is identical to the longitudinal direction of the lower substrate 11. In other words, the input electrode pattern 17 is formed to have a length in the longitudinal direction of the lower substrate 11 longer than a length in the direction perpendicular to the longitudinal direction of the lower substrate 11. A penetration hole 17a is formed in the input electrode pattern 17 so as to allow a terminal securing screw 36 to penetrate therethrough. The output electrode pattern 18 has a circular shape. A penetration hole 18a is formed in the output electrode pattern 18 so as to allow a terminal securing screw 46 to penetrate therethrough.

Other electronic components constituting the main circuit 2 and electronic components constituting the control circuit 3 are also mounted on the lower substrate 11.

The spacer bracket 12 includes a plurality of electrode accommodating portions (four electrode accommodating portions in the embodiment) 20 each of which is configured to accommodate a relay electrode (input electrode) 19. The relay electrode 19 extends along the longitudinal direction of the lower substrate 11, corresponding to the shape of the input electrode pattern 17. In the embodiment, the relay electrode 19 has a rectangular shape of which a longitudinal direction is identical to the longitudinal direction of the lower substrate 11. In other words, the relay electrode 19 is formed to have a length along the longitudinal direction of the lower substrate 11 longer than a length along the direction perpendicular to the longitudinal direction of the lower substrate 11.

A penetration hole 19a is formed in the relay electrode 19 so as to allow a terminal securing screw 36 to penetrate therethrough. When the spacer bracket 12 is mounted on the lower substrate 11, the relay electrode 19 accommodated in each electrode accommodating portion 20 is arranged in the region between element groups 16A. That is, the relay electrode 19 is arranged in the third region 11c on the lower substrate 11. The relay electrode 19 is electrically connected to the input electrode pattern 17 formed on the lower substrate 11. To prevent the relay electrode 19 being attached upside down to the spacer bracket 12, for example, a rib may be provided on the upper end surface of the relay electrode 19. In the embodiment, the relay electrode 19 is mounted on the input electrode pattern 17.

Figure 5:
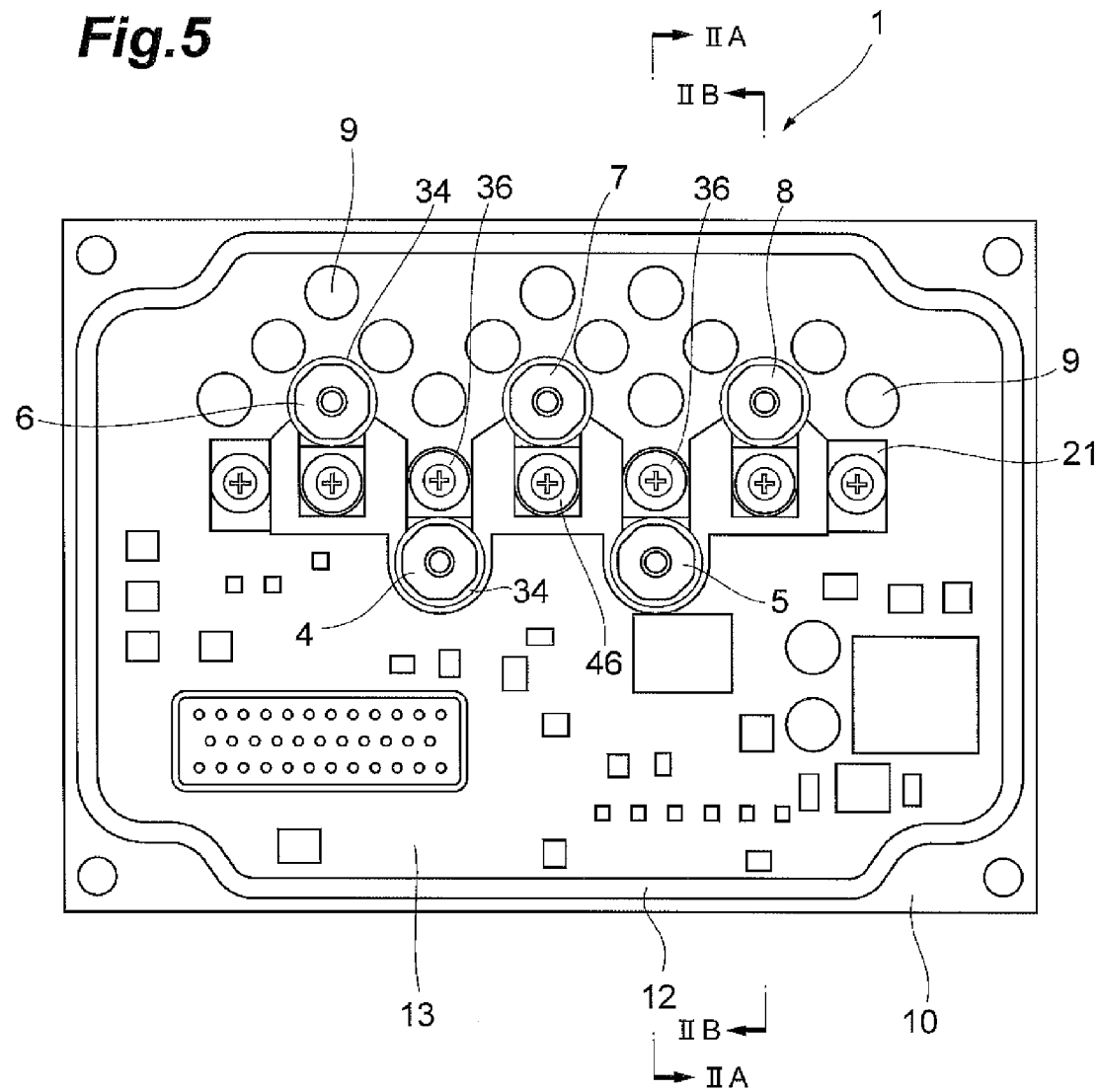
FIG. 5 is a plan view illustrating a structure of an upper substrate illustrated in FIG. 1 mounted with components.

As illustrated in FIG. 5, a plurality of capacitors 9 and a component constituting the control circuit 3 are mounted on the upper substrate 13. On the upper substrate 13, the input terminals 4 and 5 and the output terminals 6 to 8 are secured via a secure bracket 21 to a region between the region where the capacitor 9 is mounted and the region where the components of the control circuit 3 are mounted. The secure bracket 21 is secured to the heat sink 10 with a securing screw, with the upper substrate 13, the relay electrode 19, the input electrode pattern 17, and the lower substrate 11 held between the secure bracket 21 and the heat sink 10.

A current sensor 22 is provided in a region on the upper substrate 13 corresponding to securing portions of the output terminals 7 and 8. The current sensor 22 detects currents flowing in the output terminals 7 and 8. The current sensor 22 is arranged between the upper substrate 13 and the secure bracket 21.

Five holes 23 through which top end surfaces 30a and 40a of the input terminals 4 and 5 and the output terminals 6 to 8 are exposed out of the case 14 are formed in the upper portion of the case 14. The inner walls of the case 14 defining each of the holes 23 determine the position of each top end portion of the input terminals 4 and 5 and the output terminals 6 to 8.

As illustrated in (a) of FIG. 2, each of the input terminals 4 and 5 is formed in a shape with a crank (in (a) of FIG. 2, only the input terminal 5 is illustrated). Each of the input terminals 4 and 5 includes an external terminal connecting portion 30 connected to the external wiring terminal (not shown) and a substrate-fixed portion 31 securely connected to the lower circuit board 11. The substrate-fixed portion 31 is integrally and eccentrically provided to the external terminal connecting portion 30.

The external terminal connecting portion 30 has the top end surface 30a. The top end surface 30a is an external terminal securing surface to which the external wiring terminal (not shown) is secured with a bolt (not shown). The top end surface 30a is formed in a substantially polygonal shape (substantially octagonal shape in the embodiment). The hole 23 in the case 14 is formed in a substantially polygonal shape (substantially octagonal shape in the embodiment) corresponding to the shape of the top end surface 30a. A threaded portion 33 configured to engage with the bolt is formed in the external terminal connecting portion 30.

A seal attachment portion 35 is provided in the upper portion of the external terminal connecting portion 30. A seal member 34 is attached to the seal attachment portion 35 to seal the gap between the upper portion of the external terminal connecting portion 30 and the case 14. For example, a rubber O-ring is used as the seal member 34. The seal attachment portion 35 is configured to have an annular groove 35a in which the seal member 34 is fitted.

The substrate-fixed portion 31 has a penetration hole 31a which the terminal securing screw 36 penetrates therethrough. The input terminals 4 and 5 are securely connected to the lower substrate 11 with terminal securing screws 36. The input terminals 4 and 5 are secured to the lower substrate 11 through the following processes. A lower portion of the external terminal connecting portion 30 is placed on the secure bracket 21 and the substrate-fixed portion 31 is placed on the input wiring pattern (not shown) on the top surface 13a of the upper substrate 13. At this time, the relay electrode 19 is arranged between the lower substrate 11 and the upper substrate 13 so as to electrically connect the input wiring pattern (not shown) on the back surface 13b of the upper circuit board 13 and the input electrode pattern 17 on the lower substrate 11. In this state, the terminal securing screw 36 is inserted in the penetration hole 31a in the substrate-fixed portion 31 via an insulator 37. The terminal securing screw 36 penetrates through the upper substrate 13, the relay electrode 19, and the lower substrate 11 to be secured in the threaded hole formed in the heat sink 10, thereby integrally securing these plurality of members. Through these processes, the input terminals 4 and 5 are securely connected to the lower substrate 11. The input wiring pattern on the top surface 13a of the upper substrate 13 is electrically connected to the input wiring pattern on the back surface 13b of the upper substrate 13.

As illustrated in (b) of FIG. 2, each of the output terminals 6 to 8 is formed in a shape with a crank, similarly to the input terminals 4 and 5 (in (b) of FIG. 2, only the output terminal 8 is illustrated). Each of the output terminals 6 to 8 includes an external terminal connecting portion 40 connected to the external wiring terminal (not shown) and a substrate-fixed portion 41 secured to the lower circuit board 11. The substrate-fixed portion 41 is integrally and eccentrically provided to the external terminal connecting portion 40.

The external terminal connecting portion 40 has the top end surface 40a. The top end surface 40a is an external terminal securing surface to which the external wiring terminal (not shown) is secured with a bolt (not shown). Similarly to the top end surface 30a of the external terminal connecting portion 30, the top end surface 40a is formed in a substantially polygonal shape (substantially octagonal shape in the embodiment). A threaded portion 42 configured to engage with the bolt is formed in the external terminal connecting portion 40.

A seal attachment portion 43 is provided in the upper portion of the external terminal connecting portion 40. A seal member 34 is attached to the seal attachment portion 43 to seal the gap between the upper portion of the external terminal connecting portion 40 and the case 14. Similarly to the seal attachment portion 35, the seal attachment portion 43 is configured to have an annular groove 43a in which the seal member 34 is fitted.

The substrate-fixed portion 41 has a penetration hole 41a which a terminal securing screw 46 penetrates therethrough. The output terminals 6 to 8 are secured to the lower circuit board 11 through the following processes. A lower end of the external terminal connecting portion 40 is placed on the secure bracket 21 and the substrate-fixed portion 41 is placed on the output electrode pattern 18 on the lower substrate 11 via the penetration hole formed in the upper substrate 13. In this state, the terminal securing screw 46 is inserted in the penetration hole 41a in the substrate-fixed portion 41 via an insulator 47. The terminal securing screw 46 is screwed into the threaded hole formed in the heat sink 10 via the lower substrate 11. Through these processes, the output terminals 6 to 8 are secured to the lower substrate 11.

Figure 6:
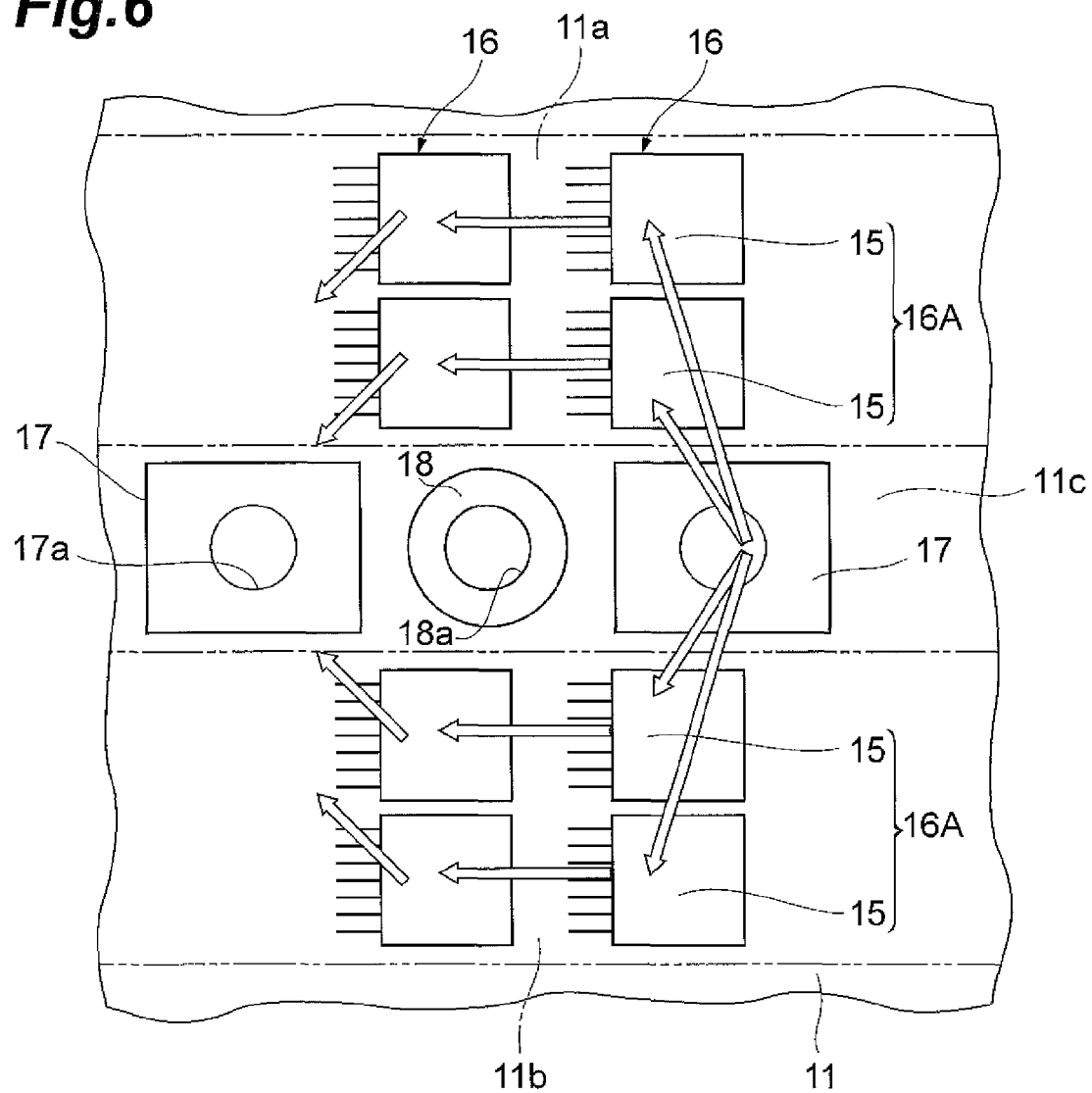
FIG. 6 illustrates the direction of currents flowing in the structure of the lower substrate mounted with components illustrated in FIG. 4.

Thus, in the embodiment, the two switching elements 15 included in the one of the element groups (the first element group) 16A are arranged in the first region 11a and the two switching elements 15 included in the other one of the element groups (the second element group) 16A are arranged in the second region 11b. The input electrode pattern 17 and the output electrode pattern 18 are arranged along the first direction in the third region 11c. The third region 11c is provided between the first region 11a and the second region 11b which are separated along the second direction. Thus, as illustrated in FIG. 6, the difference in the current path length from the input electrode pattern 17 to each switching element 15 is relatively small. Therefore, the difference in the timing of a current flowing into each switching element 15 can be reduced, and the effect of the current unbalance among switching elements 15 can thus be kept small. The input electrode pattern 17 and the output electrode pattern 18 are not arranged in the first region 11a nor in the second region 11b. The switching element 15 is not arranged in the third region 11c. The arrows in FIG. 6 indicate current paths.

Since the influence of the current unbalance among switching elements 15 can be kept small, a desired output current can be obtained without increasing the number of switching elements 15 than required.

The longitudinal length of the lower substrate 11 depends on the number of rows of the switching element groups 16. As in the embodiment, when the input electrode pattern 17 and the output electrode pattern 18 are arranged in the third region 11c located between the first region 11a and the second region 11b where the switching elements 15 are arranged, the longitudinal length of the lower substrate 11 can be shortened than the configuration in which the input electrode pattern 17 and the output electrode pattern 18 are arranged in each of the regions between the switching element groups 16. In the embodiment, at least a portion of the input electrode pattern 17 is included in the switching element group 16 constituting one of the arm elements and is located between the two switching elements 15 arrayed adjoining each other along the second direction with the third region 11c in between. Similarly, at least a portion of the output electrode pattern 18 is included in the switching element group 16 constituting another one of the arm elements adjoining the one of the arm elements along the first direction and is located between the two switching elements 15 arrayed adjoining each other along the second direction with the third region 11c in between. Thus, compared to the conventional configuration, the space for arranging electrodes can be reduced by the area corresponding to the number of rows and thereby the lower substrate 11 can be down sized. Since the input electrode pattern 17 (relay electrode 19) has the rectangular shape of which the longitudinal direction is identical to the longitudinal direction of the lower substrate 11, sufficient current-carrying area can be secured on the input electrode pattern 17 (relay electrode 19). Further, since the distance between the first region 11a and the second region 11b, that is, the distance between the two switching elements 15 arrayed adjoining each other along the second direction with the third region 11c in between can be set small, both the reduction in current unbalance among the switching elements 15 and the downsizing of the lower substrate 11 can be achieved. Thus, the inverter device 1 can be downsized.

The present invention is not limited to the embodiment described above. For example, although the input electrode pattern 17 and the relay electrode 19 are formed in rectangular shapes in the embodiment, the shapes of the input electrode pattern 17 and the relay electrode 19 are not particularly limited to rectangular shapes. The input electrode pattern 17 and the relay electrode 19 can be formed in any shape that extends along the longitudinal direction of the lower substrate 11. As long as a sufficient connecting area to carry a current can be secured, the shape of the input electrode pattern 17 and the relay electrode 19 may be a circular shape, a squared shape, or the like.

Although the switching element group 16 includes four switching elements 15 in the embodiment, the number of switching elements 15 constituting the switching element group 16 is not limited to four. The numbers of switching elements 15 included in the element groups 16A may be equal or may not be equal. If the number of switching elements 15 included in one of the element groups 16A and the number of switching elements 15 included in the other one of the element groups 16A are equal, the influence of current unbalance among element groups 16A can be kept small.

The present invention is not limited to the three-phase inverter device 1 as in the embodiment, and can be applied to, for example, a DC-DC converter.

What is claimed is:
1. A semiconductor device comprising:
a substrate provided with a main circuit including a plurality of arm elements, each of the plurality of arm elements including a plurality of semiconductor elements connected in parallel;
a plurality of input electrode units provided on the substrate and configured to supply power to the main circuit;
a plurality of output electrode units provided on the substrate and being connected to a midpoint between the two arm elements connected in series; and
a plurality of input electrodes mounted on the corresponding input electrode units, wherein
the plurality of arm elements is arrayed along a first direction of the substrate,
each of the arm elements is configured with the plurality of semiconductor elements arrayed along a second direction of the substrate perpendicular to the first direction and the plurality of semiconductor elements is separated into a first element group and a second element group,
the substrate includes a first region where the semiconductor element included in the first element group is arranged and a second region where the semiconductor element included in the second element group is arranged, the first region and the second region being separated along the second direction,
the input electrode units and the output electrode units are alternately arranged along the first direction in a third region provided between the first region and the second region on the substrate,
each of the input electrodes has a shape of which a width in the first direction is wider than a width in the second direction,
at least a portion of each input electrode unit is located between two semiconductor elements that are included in the plurality of semiconductor elements constituting one of the arm elements and are arrayed along the first direction in the third region and in between the two semiconductor elements in the second direction, and
at least a portion of each output electrode unit is located between two semiconductor elements that are included in the plurality of semiconductor elements constituting another one of the arm elements adjoining the one of the arm elements and are arrayed along the first direction in the third region and in between the two semiconductor elements constituting another one of the arm elements in the second direction.

2. The semiconductor device according to claim 1, wherein each input electrode has a rectangular shape of which a longitudinal direction is identical to the first direction.

3. The semiconductor device according to claim 1, wherein each of the arm elements is configured such that the number of the semiconductor elements included in the first element group and the number of the semiconductor elements included in the second element group are equal.

* * * * *